United States Patent
Nagano (10) Patent No.: US 6,885,608 B2
(45) Date of Patent: Apr. 26, 2005

(54) MULTI-PORT MEMORY CIRCUIT (75) Inventor: Hideo Nagano, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 375 days.

(21) Appl. No.: 10/267,800

(22) Filed: Oct. 10, 2002

(65) Prior Publication Data
US 2003/0198120 A1 Oct. 23, 2003

(30) Foreign Application Priority Data
Apr. 19, 2002 (JP) ......................................... 2002-118493

(51) Int. Cl.[7] .............................................. G11C 8/00
(52) U.S. Cl. ................... 365/230.05; 365/149; 365/222
(58) Field of Search ......................... 365/230.05, 149, 365/203, 222, 207

(56) References Cited

U.S. PATENT DOCUMENTS

| | | | |
|---|---|---|---|
| 6,396,764 B1 * | 5/2002 | Holland ................. | 365/230.03 |
| 6,501,701 B1 * | 12/2002 | Sadakata ................ | 365/230.05 |
| 6,711,048 B1 * | 3/2004 | Chien ........................ | 365/145 |
| 6,724,645 B1 * | 4/2004 | Lanham et al. ............. | 365/145 |
| 6,757,200 B1 * | 6/2004 | Keeth et al. ........... | 365/189.04 |

FOREIGN PATENT DOCUMENTS

JP  SHO 59-129989  7/1984

* cited by examiner

Primary Examiner—Tan T. Nguyen
(74) Attorney, Agent, or Firm—Burns, Doane, Swecker & Mathis, L.L.P.

(57) ABSTRACT

A memory cell includes first and second NMOS transistors and a capacitor that forms a storage node. During write operation, the first transistor is turned ON by a write address select circuit and a data bit is written on the storage node. During read operation, read bit lines are precharged, the second transistor is turned ON by a read address select circuit and the data bit held on the storage node is read. Data is read out without destruction when the storage node is at high logical level. However, if it has a low logical level, then a sense amplifier circuit outputs a low level and a refresh circuit writes a low level on the storage node.

5 Claims, 11 Drawing Sheets

| | |
|---|---|
| "H" WRITE | ONLY AT ADDRESS SELECTED BY WWS AND WBS, WW IS OPENED AND "H" IS WRITTEN BY WBL. |
| "L" WRITE | ONLY AT ADDRESS SELECTED BY WWS AND WBS, WW IS OPENED AND "L" IS WRITTEN BY WBL. |
| "H" READ | RBL IS PRECHARGED TO "H". ONLY AT ADDRESS SELECTED BY RWS AND RBS, RW IS OPENED AND DATA OF MEMORY CELL IS CONVEYED TO RBL. SINCE POTENTIAL OF BOTH RBL AND MEMORY CELL IS "H", HOWEVER, POTENTIAL OF THEM DOES NOT CHANGE. THEREFORE, DATA OF MEMORY CELL IS NOT DESTROYED, AND "H" IS HELD AS IT IS. CONCURRENTLY WITH RW OPENING, SENSE AMPLIFIER ENABLE SIGNAL BECOMES "ENABLE" TO TURN ON SENSE AMPLIFIER AND CONVEY DATA TO OUTSIDE. IF OUTPUT OF SENSE AMPLIFIER IS "H", REFRESH CIRCUIT IS KEPT OFF |
| "L" READ | RBL IS PRECHARGED TO "H". ONLY AT ADDRESS SELECTED BY RWS AND RBS, RW IS OPENED AND DATA OF MEMORY CELL IS CONVEYED TO RBL. AT THIS TIME, POTENTIAL OF MEMORY CELL IS "L" AND POTENTIAL OF RBL IS "H". THEREFORE, RW OPENING SHIFTS POTENTIAL OF MEMORY CELL TO "H" SIDE AND POTENTIAL OF RBL TO "L" SIDE. WHEN BOTH POTENTIALS COINCIDE, POTENTIAL CHANGE STOPS. IF RW IS OPENED, THEREFORE, DATA OF MEMORY CELL IS DESTROYED. CONCURRENTLY WITH RW OPENING, SENSE AMPLIFIER ENABLE SIGNAL BECOMES "ENABLE" TO TURN ON SENSE AMPLIFIER AND CONVEY DATA TO OUTSIDE. IF OUTPUT OF SENSE AMPLIFIER IS "L", THEN REFRESH CIRCUIT TURNS ON AND AGAIN WRITES "L" IN MEMORY CELL VIA RBL. AS A RESULT, DATA OF MEMORY CELL ONCE DESTROYED IS RESTORED AND IT CAN BE READ MANY TIMES. |

MULTI-PORT MEMORY CIRCUIT

BACKGROUND OF THE INVENTION

1) Field of the Invention

The present invention relates to a multi-port memory circuit, for example, such as a FIFO (First In First Out) memory.

2) Description of the Related Art

A FIFO memory is used for various applications as a data buffer between devices that are different in operation speed. The FIFO memory is a two-port memory in which a read clock is not synchronized to a write clock. The conventional FIFO memory is formed of a dynamic random access memory(DRAM) including three transistors and one capacitor per memory cell, or a static random access memory (SRAM) including eight transistors per memory cell.

Figure 9:
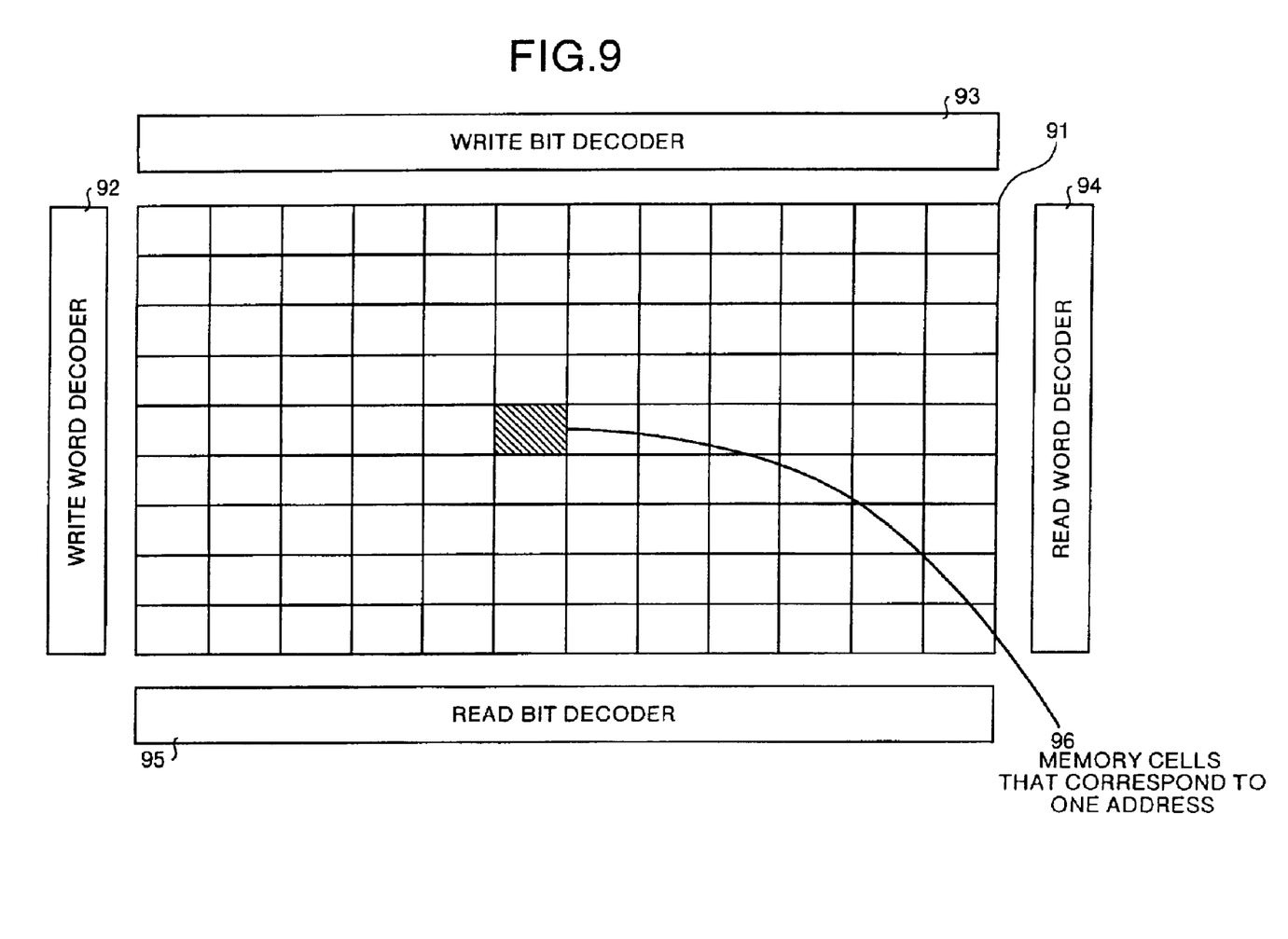
FIG. 9 is a block diagram that shows a typical configuration of an FIFO memory.
Figure 10:
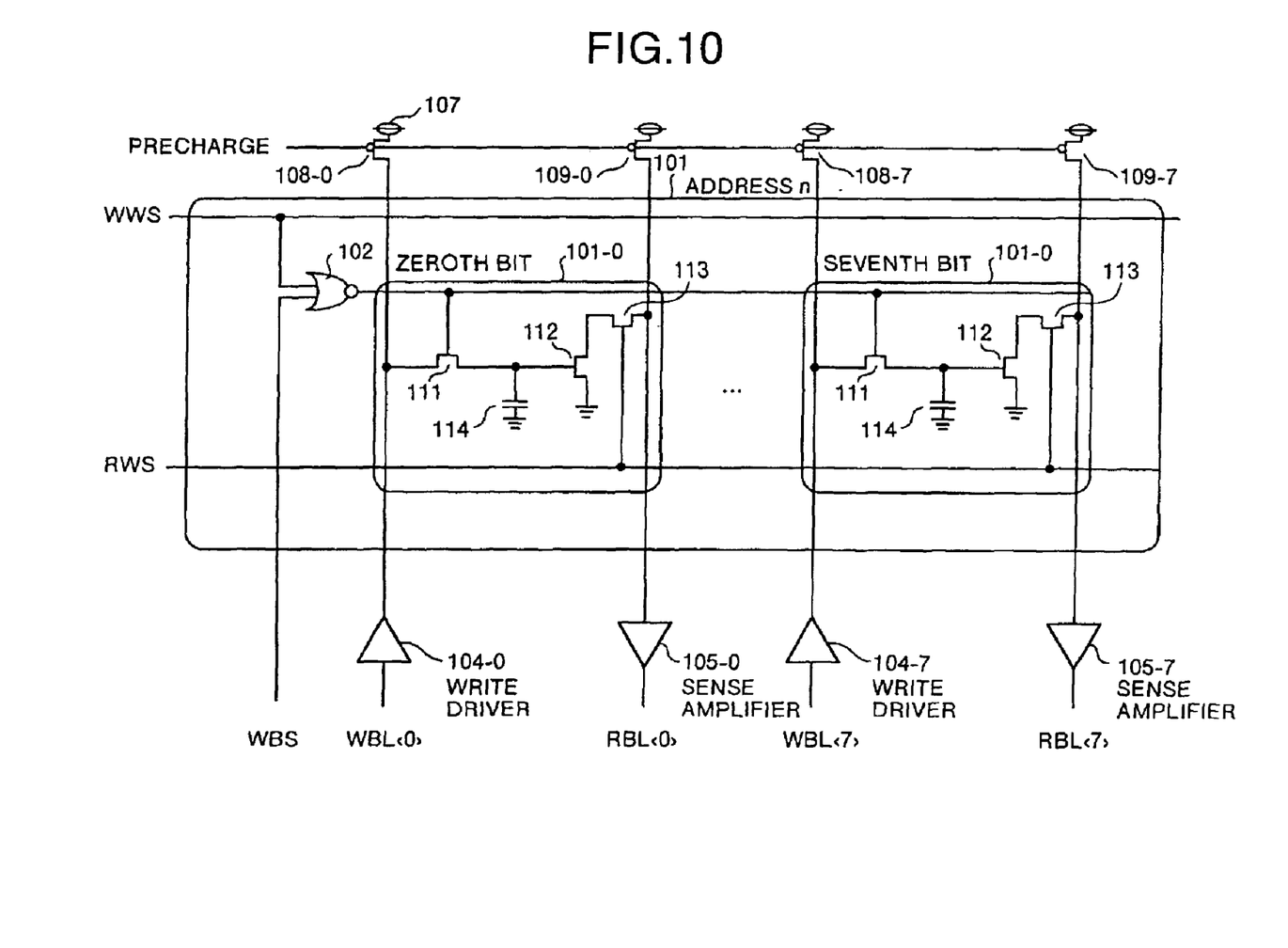
FIG. 10 is a block diagram that shows memory cells and peripheral circuits corresponding to one address, of a DRAM FIFO memory that includes three transistors and one capacitor per memory cell.
Figure 11:
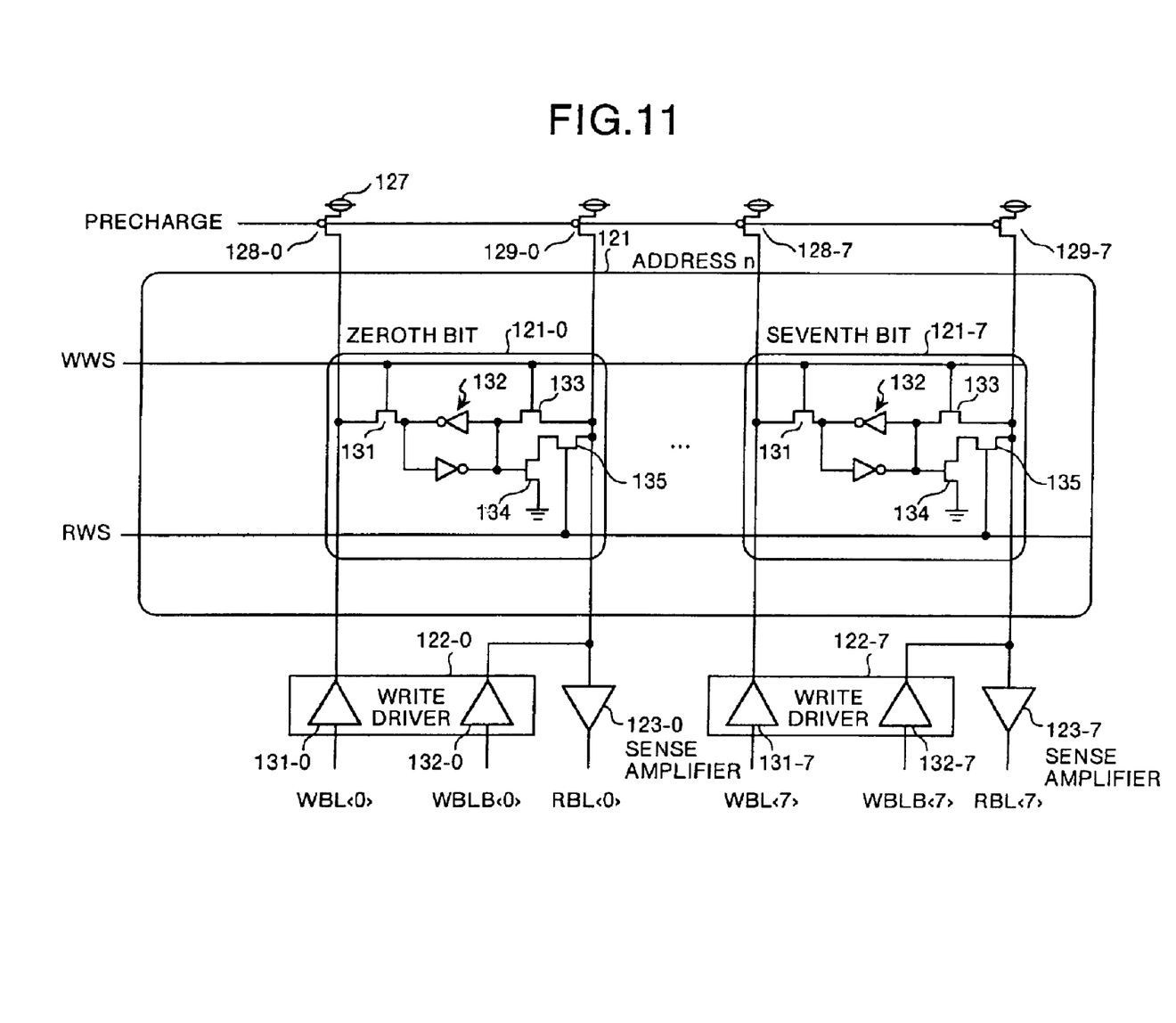
FIG. 11 is a block diagram that shows memory cells and peripheral circuits corresponding to one address, of an SRAM FIFO memory that includes eight transistors per memory cell.

Hereafter, outline of the conventional FIFO memory will be explained with reference to FIGS. 9 to 11. FIG. 9 is a block diagram that shows a typical configuration of the FIFO memory. FIG. 10 is a block diagram that shows a configuration of memory cells and peripheral circuits that correspond to one address of a DRAM FIFO memory including three transistors and one capacitor per memory cell. FIG. 11 is a block diagram that shows a configuration of memory cells and peripheral circuits that correspond to one address of a SRAM FIFO memory including eight transistors per memory cell.

In the FIFO memory, a write word decoder 92 is provided on a first end side in a row direction of a memory cell array 91 to write data, and a read word decoder 94 is provided on a second end side in the row direction to read data, as shown in FIG. 9. A write bit decoder 93 is provided on a first end side in a column direction of the memory cell array 91 to write data, and a read bit decoder 95 is provided on a second end side in the column direction to read data. Owing to this configuration, it is possible to cope with a write clock and a read clock that are asynchronously input. Memory cells 96 that correspond to one address typically include approximately 8 bits, i.e., 8 memory cells. Each of FIGS. 10 and 11 shows memory cells of 8 bits and their peripheral circuits.

In memory cells 101 of an address n shown in FIG. 10, a memory cell of zeroth bit 101-0 to a memory cell of seventh bit 101-7 are arranged on one lateral line. The memory cells 101 include a two-input NOR circuit 102. As peripheral circuits, write drivers 104-0 to 104-7 and sense amplifiers 105-0 to 105-7 are provided every eight memory cells. PMOS transistors 108-0 to 108-7 and 109-0 to 109-7 that form precharge circuits are provided so as to correspond to the write drivers 104-0 to 104-7 and the sense amplifiers 105-0 to 105-7. Write bit lines WBL<0> to WBL<7> are connected to input terminals of the write drivers 104-0 to 104-7. Read bit lines RBL<0> to RBL<7> are connected to output terminals of the sense amplifiers 105-0 to 105-7.

Gate electrodes of the PMOS transistors 108-0 to 108-7 and 109-0 to 109-7 are connected to a precharge enforcement line. Source electrodes of the PMOS transistors 108-0 to 108-7 and 109-0 to 109-7 are connected to a power supply 107. Drain electrodes of the PMOS transistors 108-0 to 108-7 are connected to output terminals of the write drivers 104-0 to 104-7, respectively. Drain electrodes of the PMOS transistors 109-0 to 109-7 are connected to input terminals of the sense amplifiers 105-0 to 105-7, respectively.

In the memory cells 101 of the address n, a write word select line WWS and a read word select line RWS are disposed in the row direction. A write bit select line WBS is disposed in the column direction. A first input terminal of the NOR circuit 102 is connected to the write word select line WWS. A second input terminal of the NOR circuit 102 is connected to the write bit select line WBS.

Eight memory cells 101-0 to 101-7 have the same configuration. Each of the memory cells 101-0 to 101-7 has three NMOS transistors 111, 112 and 113, and one capacitor 114. In other words, each of the memory cells 101-0 to 101-7 is a DRAM memory cell having three transistors and one capacitor.

The NMOS transistor 111 is connected at its gate electrode serving as a select terminal to an output line of the NOR circuit 102, connected at its source electrode to a storage node of the capacitor 114, and connected at its drain electrode to associated one of connection lines (hereafter referred to as write bit lines WBL<0> to WBL<7>) respectively between output terminals of the write drivers 104-0 to 104-7 and the drain electrodes of the NMOS transistors 108-0 to 108-7.

The NMOS transistor 112 is connected at its gate electrode to the storage node of the capacitor 114, connected at its source electrode to ground, and connected at its drain electrode to the NMOS transistor 113 at its source electrode. The NMOS transistor 113 is connected at its gate electrode serving as a select terminal to the read word select line RWS, and connected at its drain electrode to associated one of connection lines (hereafter referred to as read bit lines RBL<0> to RBL<7>) respectively between input terminals of the sense amplifiers 105-0 to 105-7 and the drain electrodes of the PMOS transistors 109-0 to 109-7.

In the configuration, the write bit lines (WBL<0> to WBL<7>) and the read bit lines (RBL<0> to RBL<7>) are precharged to assume a high level (hereafter referred to as "H" level) respectively before write operation and read operation are started.

At the time of write operation, an address on an intersection of a write word select line WWS and a write bit select line WBS is selected. In the example of FIG. 10, the address n (the memory cells 101) is selected. Only the NOR circuit 102 of the selected address n outputs the "H" level. As a result, the NMOS transistors 111 turn on. Accordingly, the memory cell 101-0 of the zeroth bit to the memory cell 101-7 of the seventh bit become active en bloc, and data write operation is conducted.

At the time of read operation, the NMOS transistors 113 are turned ON by the read word select line RWS. Accordingly, all addresses in the column direction are selected en bloc. However, the sense amplifiers 105-0 to 105-7 that correspond to the selected address n are activated. Data of eight bits stored in the memory cell 101-0 of the zeroth bit to the memory cell 101-7 of the seventh bit in the address n are read to outside. The read operation of the DRAM memory cells is nondestructive read. Therefore, the data can be read out many times as long as it is in the data holding time.

In memory cells 121 of an address n shown in FIG. 11, a memory cell of zeroth bit 121-0 to a memory cell of seventh bit 121-7 are arranged on one lateral line. As peripheral circuits, write drivers 122-0 to 122-7 and sense amplifiers 123-0 to 123-7 are provided every eight memory cells. PMOS transistors 128-0 to 128-7 and 129-0 to 129-7 that form precharge circuits are provided so as to correspond to the write drivers 122-0 to 122-7 and the sense amplifiers 123-0 to 123-7.

The write drivers 122-0 to 122-7 respectively include write drivers 131-0 to 131-7 connected at their input terminals to write bit lines WBL<0> to WBL<7>, and write drivers 132-0 to 132-7 connected at their input terminals to write bit lines WBLB<0> to WBLB<7>. Output terminals of the write drivers 132-0 to 132-7 are connected to input terminals of the sense amplifiers 123-0 to 123-7, respectively. Read bit lines RBL<0> to RBL<7> are connected to output terminals of the sense amplifiers 123-0 to 123-7, respectively.

Gate electrodes of the PMOS transistors 128-0 to 128-7 and 129-0 to 129-7 are connected to a precharge enforcement line. Source electrodes of the PMOS transistors 128-0 to 128-7 and 129-0 to 129-7 are connected to a power supply 127. Drain electrodes of the PMOS transistors 128-0 to 128-7 are connected to output terminals of the write drivers 131-0 to 131-7, respectively. Drain electrodes of the PMOS transistors 129-0 to 129-7 are connected to the output terminals of the write drivers 132-0 to 132-7 and the input terminals of the sense amplifiers 123-0 to 123-7, respectively.

In the memory cells 101 of the address n, a write word select line WWS and a read word select line RWS are disposed in the row direction. Eight memory cells 121-0 to 121-7 have the same configuration. Each of the memory cells 121-0 to 121-7 includes a storage element 132 represented by anti-parallel connection of inverters, and NMOS transistors 131, 133, 134 and 135. Each of the inverters included in the storage element 132 has two NMOS transistors. Therefore, each of the memory cells 121-0 to 121-7 is an SRAM memory cell that has eight NMOS transistors in all.

The NMOS transistor 131 is connected at its gate electrode serving as a select terminal to the write word select line WWS, connected at its source electrode to a first node of the storage element 132, and connected at its drain electrode to associated one of connection lines respectively between the output terminals of the write drivers 131-0 to 131-7 and the drain electrodes of the NMOS transistors 128-0 to 128-7.

The NMOS transistor 133 is connected at its gate electrode serving as a select terminal to the write word select line WWS, connected at its source electrode to a second node of the storage element 132, and connected at its drain electrode to the NMOS transistor 135 at its drain electrode and to associated one of connection lines respectively among the output terminals of the write drivers 132-0 to 132-7, the input terminals of the sense amplifiers 123-0 to 123-7, and the drain electrodes of the PMOS transistors 129-0 to 129-7. In other words, the write bit lines WBLB<0> to WBLB<7> respectively connected to the input terminals of the write drivers 132-0 to 132-7 respectively join the read bit lines RBL<0> to RBL<7>, and are connected to the memory cells 121-0 to 121-7, respectively.

The NMOS transistor 134 is connected at its gate electrode to the second node of the storage element 132 together with the source electrode of the NMOS transistor 133, and connected at its source electrode to ground. The NMOS transistor 135 is connected at its gate electrode serving as a select terminal to the read word select line RWS, and connected at its source electrode to the NMOS transistor 134 at its drain electrode.

In the configuration, the write bit lines and the read bit lines are precharged to assume the "H" level respectively before write operation and read operation are started. At the time of write operation, the NMOS transistors 131 and 133 are turned ON by the write word select line WWS. All addresses in the column direction are selected en bloc. However, the write drivers 122-0 to 122-7 selected by eight write bit lines that pass through the address n to be written are activated. Write operation to the address n is conducted. In the SRAM, only data of a low level (hereafter referred to as "L" level) can be written because of its structure. Therefore, the write drivers 131-0 to 131-7 are selected by the write bit lines WBL<0> to WBL<7> and the write drivers 132-0 to 132-7 are selected by the write bit lines WBLB<0> to WBLB<7>, and thereby write operation is conducted.

At the time of read operation, the NMOS transistors 135 are turned ON by the read word select line RWS. Accordingly, all addresses in the column direction are selected en bloc. However, the sense amplifiers 123-0 to 123-7 that correspond to the selected address n are activated. Data of eight bits stored in the memory cell 101-0 of the zeroth bit to the memory cell 101-7 of the seventh bit in the address n are read to outside. The read operation of the SRAM memory cells is nondestructive read. Therefore, the data can be read out many times. There is no problem of data holding.

In the FIFO memory using the SRAM memory cells, there is no restriction on data holding time. Since the number of transistors is large, however, the area of memory cells becomes larger than that of DRAM memory cells. Thus, it is difficult to reduce the chip size.

On the other hand, the FIFO memory using the DRAM memory cells can be reduced in size than the FIFO memory using the SRAM memory cells. However, a NOR circuit serving as the write select circuit is needed per address. When the number of bits per address is small, therefore, the proportion of the NOR circuit in the area of the memory cell becomes large. In addition, when there is no refresh circuit as shown in FIG. 10, there is a problem of a full-time restriction of the data holding time.

SUMMARY OF THE INVENTION

It is an object of the present invention to provide a multi-port memory circuit that can be reduced in chip size by adopting DRAM memory cells each having two transistors and one capacitor.

In the multi-port memory circuit according to the present invention each memory cell is a dynamic memory cell including first and second NMOS transistors and a capacitor that forms a storage node. During write operation, the first NMOS transistor is turned ON by a write address select circuit of an address selected by a write word select signal that orders data word writing and a write bit select signal that orders data bit writing, and a data bit is thus written on the storage node. During read operation, read bit lines are precharged, the second NMOS transistor is turned ON by a read word select signal that orders data word readout, all addresses in the row direction are selected, a sense amplifier circuit is activated by a sense amplifier enable circuit at an address selected by an activated read bit line, and a data bit held on the storage node is read out. Data is read without destruction when the storage node is at a high level. If the storage node is at a low level, then the read bit line is at a high level because of the precharge. Therefore, potential levels are changed so as to balance the potentials. In other words, data destruction is caused. If the sense amplifier circuit outputs the low level, therefore, a refresh circuit conducts a refresh operation in an interval during which the sense amplifier enable signal is at the low level, and thereby writes a low level on the storage node and restores the low level data bit.

These and other objects, features and advantages of the present invention are specifically set forth in or will become apparent from the following detailed descriptions of the invention when read in conjunction with the accompanying drawings.

DETAILED DESCRIPTIONS

Embodiments of the multi-port memory circuit according to the present invention will be explained in detail with reference to accompanying drawings.

Figure 1:
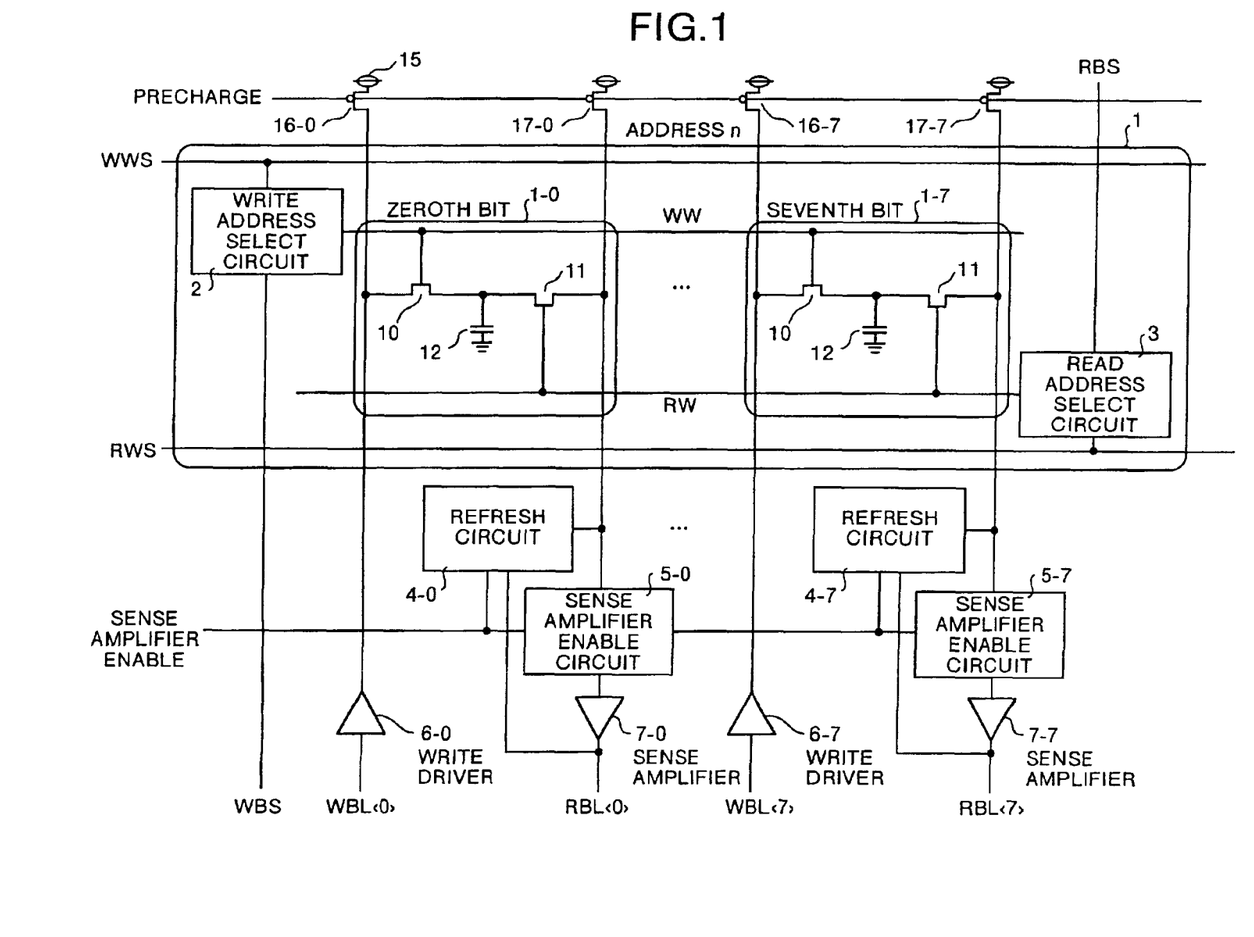
FIG. 1 is a block diagram that shows a configuration of a first embodiment of a multi-port memory according to the present invention.

FIG. 1 is a block diagram that shows a configuration of a first embodiment of a multi-port memory according to the present invention. In FIG. 1, in memory cells 1 of an address n in the configuration of the FIFO memory shown in, for example, FIG. 9, a memory cell of zeroth bit 1-0 to a memory cell of seventh bit 1-7 are arranged on one lateral line. The memory cells 1 include a write address select circuit 2 and a read address select circuit 3. As peripheral circuits, refresh circuits 4-0 to 4-7, sense amplifier enable circuits 5-0 to 5-7, write drivers 6-0 to 6-7, and sense amplifier circuits 7-0 to 7-7 are provided every eight memory cells.

PMOS transistors 16-0 to 16-7 and 17-0 to 17-7 that form precharge circuits are provided so as to correspond to the write drivers 6-0 to 6-7 and the sense amplifier circuits 7-0 to 7-7. Write bit lines WBL<0> to WBL<7> are connected to input terminals of the write drivers 6-0 to 6-7. Read bit lines RBL<0> to RBL<7> are connected to output terminals of the sense amplifier circuits 7-0 to 7-7.

Gate electrodes of the PMOS transistors 16-0 to 16-7 and 17-0 to 17-7 are connected to a precharge enforcement line. Source electrodes of the PMOS transistors 16-0 to 16-7 and 17-0 to 17-7 are connected to a power supply 15. Drain electrodes of the PMOS transistors 16-0 to 16-7 are connected to output terminals of the write drivers 6-0 to 6-7, respectively. Drain electrodes of the PMOS transistors 17-0 to 17-7 are connected to input terminals of the sense amplifier circuits 7-0 to 7-7, respectively.

In the memory cells 1 of the address n, a write word select line WWS and a read word select line RWS are disposed in the row direction. A write bit select line WBS and a read bit select line RBS are disposed in the column direction. A first input terminal of the write address select circuit 2 is connected to the write word select line WWS. A second input terminal of the write address select circuit 2 is connected to the write bit select line WBS. An output terminal of the write address select circuit 2 is connected to a write word line WW that is effective in only the memory cells 1. A first input terminal of the read address select circuit 3 is connected to the read word select line RWS. A second input terminal of the read address select circuit 3 is connected to the read bit select line RBS. An output terminal of the read address select circuit 3 is connected to a read word line RW that is effective in only the memory cells 1.

Eight memory cells 1-0 to 1-7 have the same configuration. Each of the memory cells 1-0 to 1-7 has two NMOS transistors 10 and 11, and one capacitor 12. In other words, each of the memory cells 1-0 to 1-7 is a DRAM memory cell having two transistors and one capacitor.

The NMOS transistor 10 is connected at its gate electrode serving as a select terminal to the write word line WW, connected at its source electrode to a storage node of the capacitor 12, and connected at its drain electrode to associated one of connection lines (hereafter referred to as write bit lines (WBL<0> to WBL<7>)) respectively between output terminals of the write drivers 6-0 to 6-7 and the drain electrodes of the PMOS transistors 16-0 to 16-7.

The NMOS transistor 11 is connected at its gate electrode serving as a select terminal to the read word line RW, connected at its source electrode to a storage node of the capacitor 12, and connected at its drain electrode to associated one of connection lines (hereafter referred to as read bit lines (RBL<0> to RBL<7>)) respectively among the drain electrodes of the PMOS transistors 17-0 to 17-7, output terminals of the refresh circuits 4-0 to 4-7, and input terminals of the sense amplifier enable circuits 5-0 to 5-7. The input terminals of the sense amplifier circuits 7-0 to 7-7 are connected to output terminals of the sense amplifier enable circuits 5-0 to 5-7, respectively. First input terminals of the refresh circuits 4-0 to 4-7 are connected to output terminals of the sense amplifier circuits 7-0 to 7-7, respectively.

A sense amplifier enable signal is a signal that becomes the "H" level in an address to be read, only for a predetermined interval. The sense amplifier enable signal is input to second input terminals of the sense amplifier enable circuits 5-0 to 5-7 and second input terminals of the refresh circuits 4-0 to 4-7.

At the time of read operation, the sense amplifier enable circuits 5-0 to 5-7 conduct operation of enabling the sense amplifier circuits 7-0 to 7-7, respectively, by using the sense amplifier enable signal. The refresh circuits 4-0 to 4-7 respectively refresh the storage nodes of the memory cells 1 via the read bit lines (RBL<0> to RBL<7>), respectively, on the basis of the outputs of the sense amplifier circuits 7-0 to 7-7, respectively, and the sense amplifier enable signal.

Operation of the multi-port memory of the first embodiment will now be explained with reference to FIGS. 1 to 3.

Figure 2:
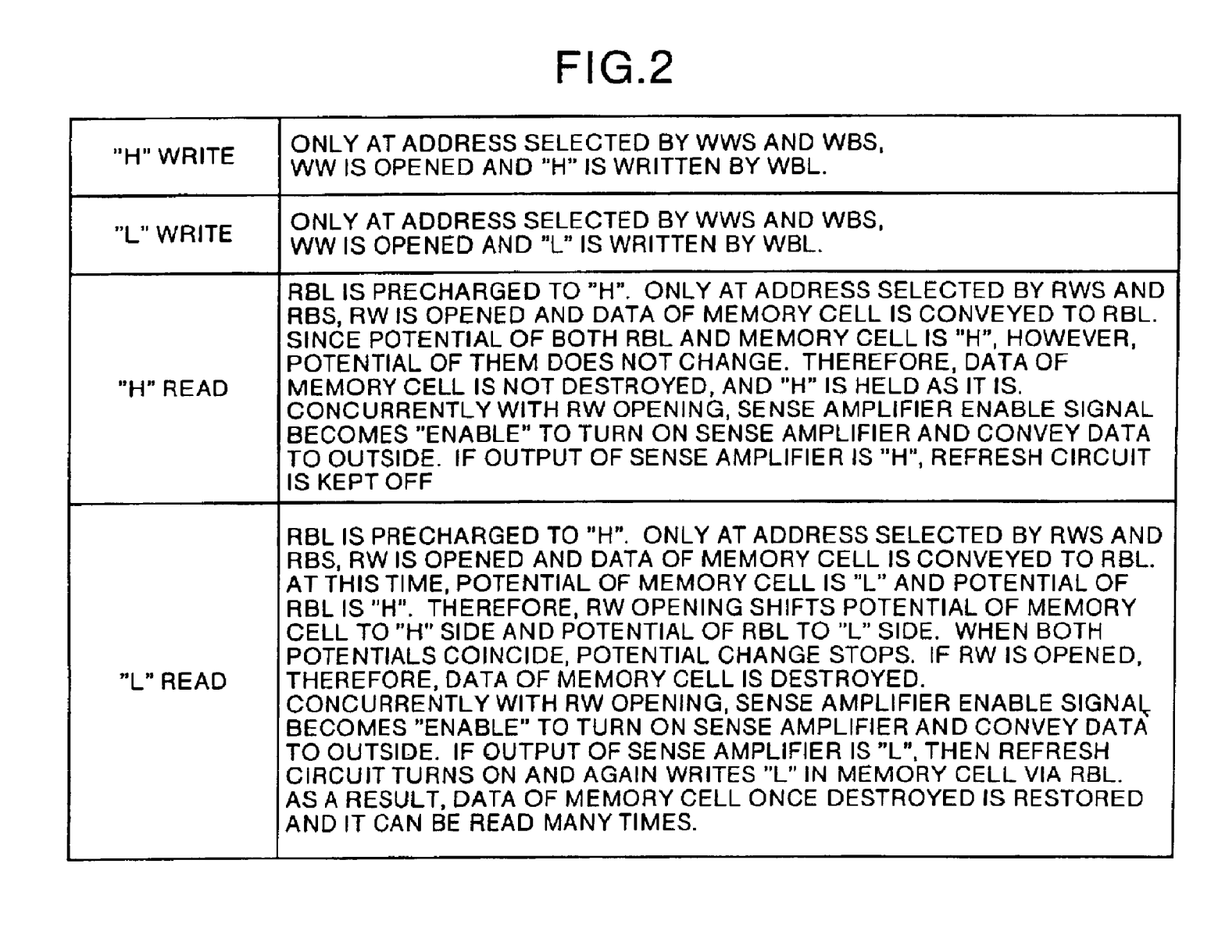
FIG. 2 is a diagram that shows a write operation and a read operation in the multi-port memory shown in FIG. 1.

FIG. 2 is a diagram that shows a write operation and a read operation in the multi-port memory shown in FIG. 1. FIG. 3 is a timing chart that shows a read operation of "L" level data in the multi-port memory shown in FIG. 1.

With reference to FIG. 2, before a write operation is started, the PMOS transistors 16-0 to 16-7 are turned on, and consequently the write bit lines (WBL<0> to WBL<7>) are precharged to assume the "H" level. Thereafter, the PMOS transistors 16-0 to 16-7 are turned off, and consequently the write bit lines (WBL<0> to WBL<7>) are brought into a floating state, and the write operation is conducted.

At the time of write operation of "H" level data and "L" level data, an address of an intersection of the write word select line WWS with the write bit select line WBS, such as the address n (the memory cells 1) in the example of FIG. 1, is selected. At the selected address n, the write address select circuit 2 outputs an "H" level for a predetermined interval. As a result, the write word line WW that is effective in only the memory cells 1 is activated for a predetermined interval, and the gate is opened, so to speak. As a result, the NMOS transistors 10 turn ON. Therefore, "H" level data or "L" level data supplied to the write bit lines WBL<0> to WBL<7> is written on the storage nodes in the memory cells 1-0 to 1-7 by the write drivers 6-0 to 6-7, respectively.

At the time of read operation, the PMOS transistors 17-0 to 17-7 are turned on, and consequently the read bit lines (RBL<0> to RBL<7>) are precharged to assume the "H" level. Thereafter, an address of an intersection of the read word select line RWS with the read bit select line RBS, such as the address n (the memory cells 1) in the example of FIG. 1, is selected. At the selected address n, the read address select circuit 3 outputs an "H" level for a predetermined interval. As a result, the read word line RW that is effective in only the memory cells 1 is activated for a predetermined interval, and the gate is opened, so to speak. As a result, the NMOS transistors 11 turn ON. At the same time, the sense amplifier enable circuits 5-0 to 5-7 are enabled by the sense amplifier enable signal. Accordingly, the sense amplifier circuits 7-0 to 7-7 are activated. Thus, data held by the storage nodes in the memory cells 1 are output to read bit lines RBL<0> to RBL<7> that are extended to the outside.

If at this time a storage node in the memory cells 1 holds "H" level data, its potential is equal to the precharge potential of the read bit lines (RBL<0> to RBL<7>). Even if the NMOS transistors 11 turn on, therefore, data destruction does not occur and the "H" level data is held on the storage node as it is. As a result, "H" level data is output from a corresponding one of the sense amplifier circuits 7-0 to 7-7 to corresponding one of the read bit lines RBL<0> to RBL<7> extended to the outside. Since the output of the corresponding one of the sense amplifier circuits 7-0 to 7-7 is the "H" level, corresponding one of the refresh circuits 4-0 to 4-7 keeps the OFF operation state.

On the other hand, it is supposed that a storage node in the memory cells 1 holds the "L" level data. When the NMOS transistor 11 turns ON, the potential of the storage node in the memory cells 1 is shifted to the "H" level side because the precharge potential of the read bit lines (RBL<0> to RBL<7>) is the "H" level. The potential of corresponding one of the read bit lines (RBL<0> to RBL<7>) is shifted to the "L" level side. When both potentials become equal, the potential change is stopped. In other words, if the read word line RW opens and the NMOS transistors 11 turn ON when a storage node in the memory cells 1 holds the "L" level data, data held on the storage node is destroyed.

If "L" level data is output from any of the sense amplifier circuits 7-0 to 7-7 to corresponding ones of the read bit lines RBL<0> to RBL<7> extended to the outside, corresponding ones of the refresh circuits 4-0 to 4-7 turn ON in response to the sense amplifier enable signal turning to the "L" level, and write the "L" level data again on the corresponding storage nodes in the memory cells 1 via corresponding ones of the read bit lines (RBL<0> to RBL<7>) As a result, the "L" level data in the memory cells once destroyed can also be restored. In the same way as the "H" level data, therefore, the "L" level data can also be read many times correctly. To be concrete, the read operation is conducted as shown in FIG. 3.

Figure 3:
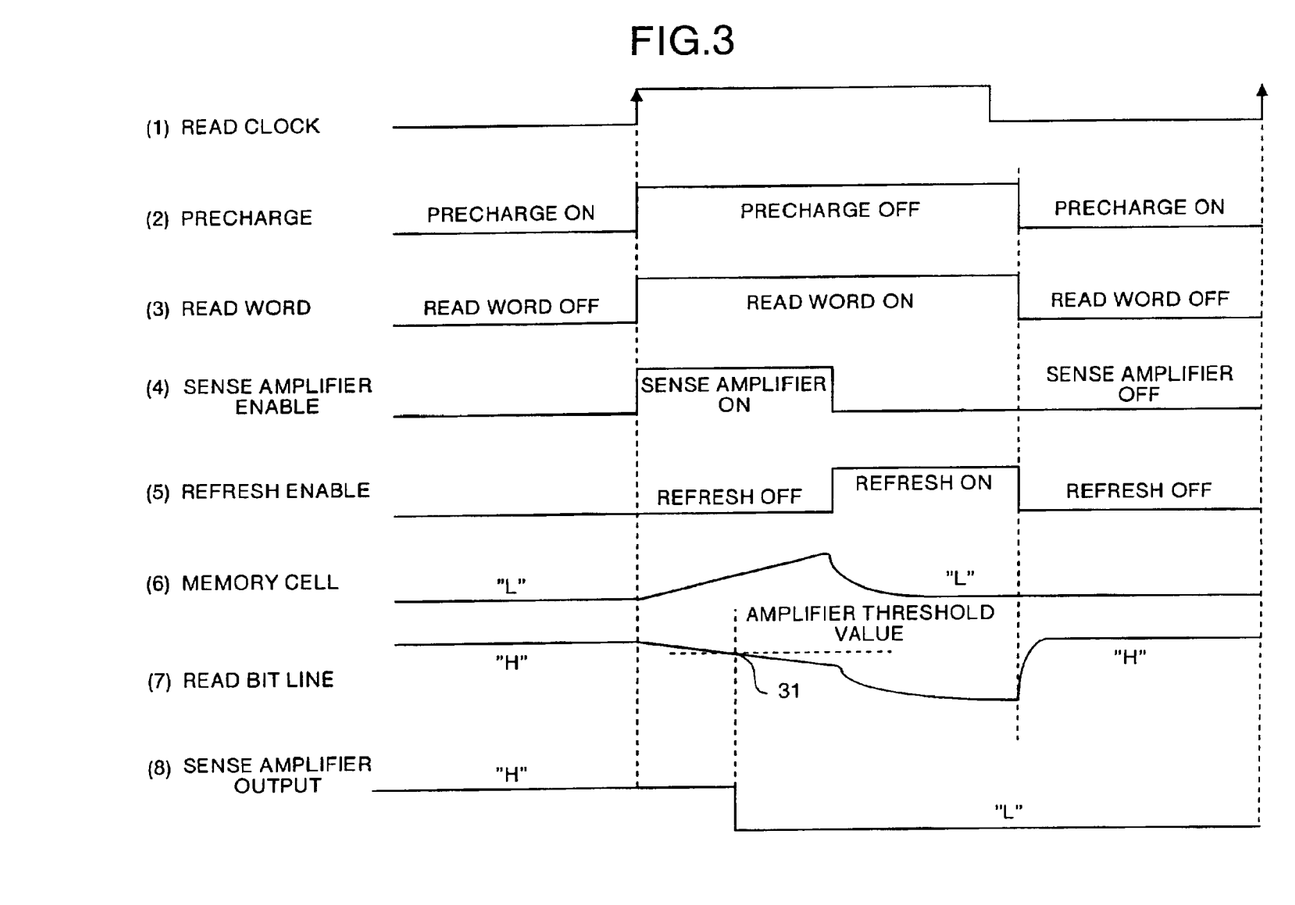
FIG. 3 is a timing chart that shows a read operation of "L" level data in the multi-port memory shown in FIG. 1.

Following points (1) through (8) can be mentioned with reference to FIG. 3:

(1) the read clock is generated asynchronously from the write clock, which is not shown.

(2) As for precharge operation control, precharge ON intervals during which precharge is conducted and precharge OFF intervals during which precharge is not conducted are provided alternately. The precharge OFF interval is defined as a predetermined interval between a rising edge of the read clock and an instant after a falling edge of the read clock. The precharge ON interval is defined as an interval between an instant of the end of the precharge OFF interval and a rising edge of the read clock.

(3) The level of the read word line RW is changed in synchronism with the ON/OFF intervals of the precharge operation control. In other words, the read word line RW is at the "L" level (read word OFF) during the interval of precharge ON, whereas the read word line RW is at the "H" level (read word ON) during the interval of precharge OFF.

(4) The sense amplifier enable signal rises to the "H" level in synchronism with a rising edge of the read word line RW from the "L" level to the "H" level. When a predetermined time has elapsed in the read word ON interval, the sense amplifier enable signal falls to the "L" level. The interval during which the sense amplifier enable signal is at the "H" level is an interval (sense amplifier ON) during which the sense amplifier circuits 7-0 to 7-7 are activated. The interval during which the sense amplifier enable signal is at the "L" level is an interval (sense amplifier OFF) during which the sense amplifier circuits 7-0 to 7-7 are inactivated.

(5) A refresh enable signal is generated in the refresh circuits 4-0 to 4-7. While the sense amplifier enable signal is at the "H" level (sense amplifier ON) in the precharge OFF interval, the refresh enable signal is at the "L" level (refresh OFF). When the sense amplifier enable signal falls from the "H" level (sense amplifier ON) to the "L" level (sense amplifier OFF) after the sense amplifier circuits 7-0 to 7-7 have output the "L" level, the refresh enable signal becomes the "H" level (refresh ON). Until the precharge OFF interval finishes, the state of the "H" level is sustained.

In other words, the refresh circuits 4-0 to 4-7 conduct the refresh operation in an interval during which the refresh enable signal is at the "H" level (refresh ON). As a matter of course, the refresh operation is not conducted in the precharge ON interval, during which precharge is being effected (refresh OFF).

(6) When data held in a memory cell is "L" level data, then the potential of the storage node of the memory cell is gradually shifted to the "H" level side by the termination of the precharge operation (precharge OFF) and raised during the refresh OFF interval. In the refresh ON interval, the "L" level data is written again on the storage node of the memory cell. The data held in the memory cell is restored as the "L" level data.

(7) The potential of the read bit lines (RBL<0> to RBL<7>) is at the "H" level because of precharge when the refresh OFF interval is started. However, the potential of the read bit lines RBL<0> to RBL<7> is gradually shifted to the "L" level side, and gently lowered toward the "L" level until the refresh OFF interval is finished. On the way, there exists a threshold value 31 of the sense amplifier circuits 7-0 to 7-7. In the refresh ON interval, the falling speed is accelerated. The potential falls greatly until the precharge OFF interval finishes. Thereafter, when the precharge ON interval is started, the potential returns to the original "H" level.

(8) The potential of the read bit lines (RBL<0> to RBL<7>) is set to the "H" level by the precharge. When the precharge OFF interval has started, therefore, the sense amplifier circuits 7-0 to 7-7 output the "H" level in response to the sense amplifier ON of the sense amplifier enable signal. In the precharge OFF interval, the "H" level is maintained until the potential of the read bit lines (RBL<0> to RBL<7>) arrives at the amplifier threshold value 31. When the potential of the read bit lines (RBL<0> to RBL<7>) has arrived at the amplifier threshold value 31, the outputs of the sense amplifier circuits 7-0 to 7-7 become the "L" level. Thereafter, the refresh operation is carried out.

In this way, a multi-port memory can be formed by using a DRAM cell formed of two transistors and one capacitor as a memory cell. Therefore, it becomes possible to reduce the area of the memory cell and reduce the chip size. Read operation is conducted only at an address selected by the read address select circuit. Therefore, the power consumption can be reduced.

Figure 4:
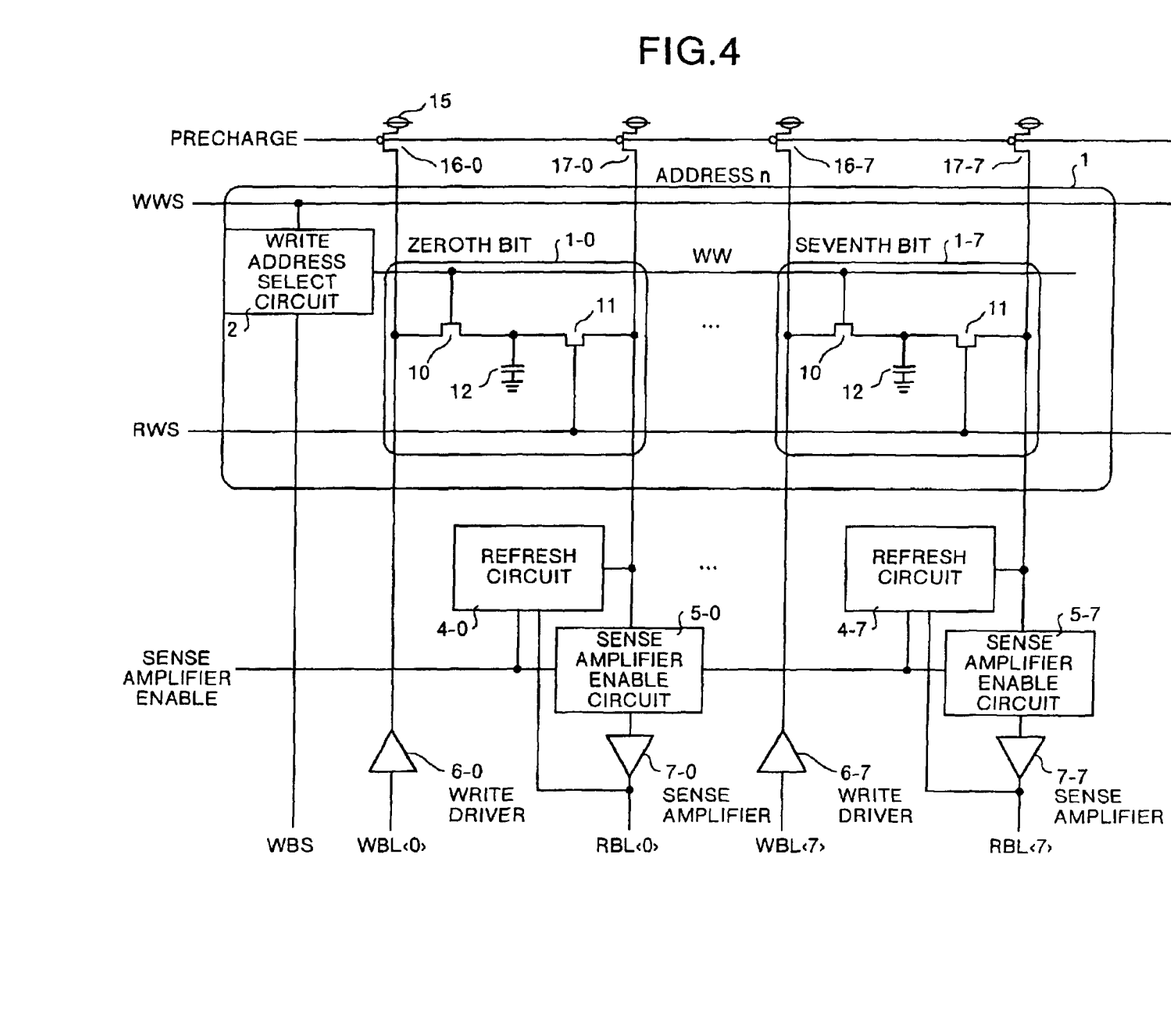
FIG. 4 is a block diagram that shows a configuration of a second embodiment of a multi-port memory according to the present invention.

FIG. 4 is a block diagram that shows a configuration of a second embodiment of a multi-port memory according to the present invention. In FIG. 4, components that are the same as or equivalent to those shown in FIG. 1 are denoted by like characters. Components concerning the second embodiment will now be explained mainly.

As shown in FIG. 4, the multi-port memory of the second embodiment has a configuration obtained by removing the read address select circuit 3 from the configuration of the first embodiment (FIG. 1). As a result, the read bit select line RBS is removed. In the memory cell 1-0 of the zeroth bit to the memory cell 1-7 of the seventh bit in the memory cells 1, the gate electrodes of the NMOS transistors 11 are connected directly to the read word select line RWS.

In the configuration, write operation is conducted in the same way as the first embodiment. At the time of write operation of "H" level data and "L" level data after the precharge, an address of an intersection of the write word select line WWS with the write bit select line WBS, such as the address n (the memory cells 1) in the example of FIG. 4, is selected. At the selected address n, the write address select circuit 2 outputs an "H" level for a predetermined interval. As a result, the write word line WW that is effective in only the memory cells 1 is activated, and the gate is opened, so to speak. As a result, the NMOS transistors 10 turn ON. Therefore, "H" level data or "L" level data supplied to the write bit lines WBL<0> to WBL<7> is written on the storage nodes in the memory cells 1-0 to 1-7 by the write drivers 6-0 to 6-7, respectively.

At the time of read operation, the PMOS transistors 17-0 to 17-7 are turned on, and consequently the read bit lines (RBL<0> to RBL<7>) are precharged to assume the "H" level. Thereafter, the NMOS transistors 11 are turned ON by the read word select line RWS. All addresses in the row direction are selected. However, the read bit lines RBL<0> to RBL<7> corresponding to the sense amplifier circuits 7-0 to 7-7 that in turn correspond to the selected address n are activated. At the same time, the sense amplifier circuits 7-0 to 7-7 are activated by the sense amplifier enable circuits 5-0 to 5-7. Thus, data held by the storage nodes in the memory cells 1 are output to read bit lines RBL<0> to RBL<7> that are extended to the outside.

If at this time a storage node in the memory cells 1 holds "H" level data, its potential is equal to the precharge potential of the read bit lines (RBL<0> to RBL<7>). Even if the NMOS transistors 11 turn on, therefore, data destruction does not occur and the "H" level data is held on the storage node as it is. As a result, "H" level data is output from a corresponding one of the sense amplifier circuits 7-0 to 7-7 to corresponding one of the read bit lines RBL<0> to RBL<7> extended to the outside. Since the output of the corresponding one of the sense amplifier circuits 7-0 to 7-7 is the "H" level, corresponding one of the refresh circuits 4-0 to 4-7 keeps the OFF operation state.

On the other hand, it is supposed that a storage node in the memory cells 1 holds the "L" level data. When the NMOS transistor 11 turns ON, the potential of the storage node in the memory cells 1 is shifted to the "H" level side because the precharge potential of the read bit lines (RBL<0> to RBL<7>) is the "H" level. The potential of corresponding one of the read bit lines (RBL<0> to RBL<7>) is shifted to the "L" level side. When both potentials become equal, the potential change is stopped. In other words, if the read word line RW opens and the NMOS transistors 11 turn ON when a storage node in the memory cells 1 holds the "L" level data, data held on the storage node is destroyed.

If "L" level data is output from any of the sense amplifier circuits 7-0 to 7-7 to corresponding ones of the read bit lines RBL<0> to RBL<7> extended to the outside, therefore, corresponding ones of the refresh circuits 4-0 to 4-7 turn ON in response to the sense amplifier enable signal turning to the "L" level, and write the "L" level data again on the corresponding storage nodes in the memory cells 1 via corresponding ones of the read bit lines (RBL<0> to RBL<7>). As a result, the "L" level data in the memory cells once destroyed can also be restored. In the same way as the "H" level data, therefore, the "L" level data can also be read many times correctly.

Thus, according to the second embodiment, read operation can be conducted properly even if the read address select circuit shown in the first embodiment is removed. In the same way as the first embodiment, therefore, it becomes possible to reduce the area of the memory cell and reduce the chip size. In addition, since the read address select circuit can be removed, the chip size can be further reduced as compared with the first embodiment.

Figure 5:
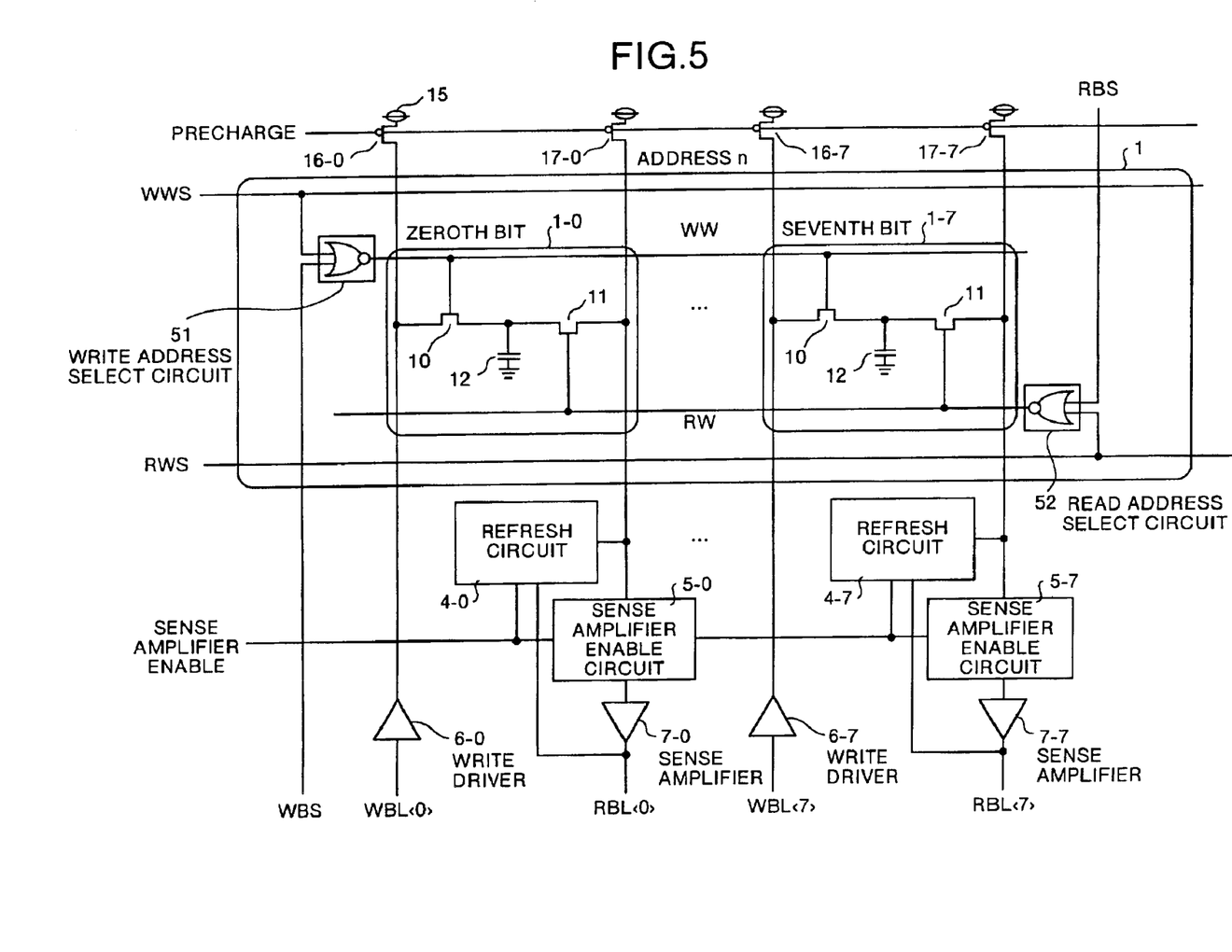
FIG. 5 is a block diagram that shows a configuration of a third embodiment of a multi-port memory according to the present invention.

FIG. 5 is a block diagram that shows a configuration of a third embodiment of a multi-port memory according to the present invention. In FIG. 5, components that are the same as or equivalent to those shown in FIG. 1 are denoted by like characters. Components concerning the third embodiment will now be explained mainly.

As shown in FIG. 5, the multi-port memory of the third embodiment has a configuration obtained by replacing the write address select circuit 2 and the read address select circuit 3 in the configuration of the first embodiment (FIG. 1) by a write address select circuit 51 formed of a NOR circuit and a read address select circuit 52 formed of a NOR circuit, respectively.

In the write address select circuit 51, the write word select line WWS is connected to a first input of the NOR circuit and the write bit select line WBS is connected to a second input of the NOR circuit. The write word line WW is connected to an output terminal of the NOR circuit. In the read address select circuit 52, the read word select line RWS is connected to a first input of the NOR circuit and the read bit select line RBS is connected to a second input of the NOR circuit. The read word line RW is connected to an output terminal of the NOR circuit.

According to this configuration, an operation and effects similar to those of the first embodiment can be obtained. According to the third embodiment, therefore, it becomes possible to reduce the area of the memory cell and chip size in the same way as the first embodiment. In addition, since the read operation is conducted only in the address selected by the read address select circuit, it becomes possible to reduce the power consumption.

Figure 6:
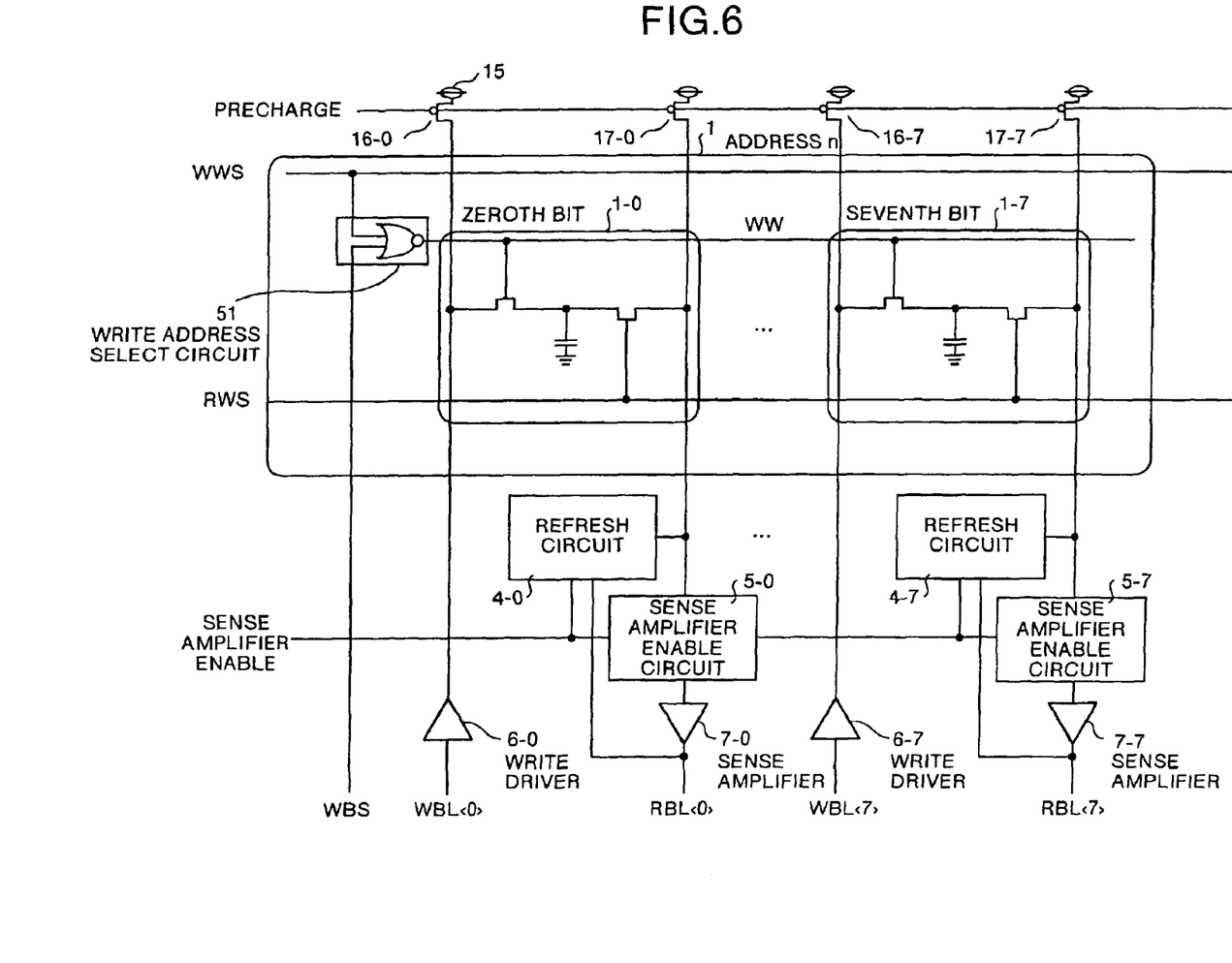
FIG. 6 is a block diagram that shows a configuration of a fourth embodiment of a multi-port memory according to the present invention.

FIG. 6 is a block diagram that shows a configuration of a fourth embodiment of a multi-port memory according to the present invention. In FIG. 6, components that are the same as or equivalent to those shown in FIG. 5 are denoted by like characters. Components concerning the fourth embodiment will now be explained mainly.

As shown in FIG. 6, the multi-port memory of the fourth embodiment has a configuration obtained by removing the read address select circuit 52 from the configuration of the third embodiment (FIG. 5). As a result, the read bit select line RBS is removed. In the memory cell 1-0 of the zeroth bit to the memory cell 1-7 of the seventh bit in the memory cells 1, the gate electrodes of the NMOS transistors 11 are connected directly to the read word select line RWS.

Thus, according to this configuration, read operation can be conducted properly even if the read address select circuit shown in the third embodiment is removed. In the same way as the second embodiment, therefore, it becomes possible in the fourth embodiment to reduce the chip size. In addition, since the read address select circuit can be removed, the chip size can be further reduced.

Figure 7:
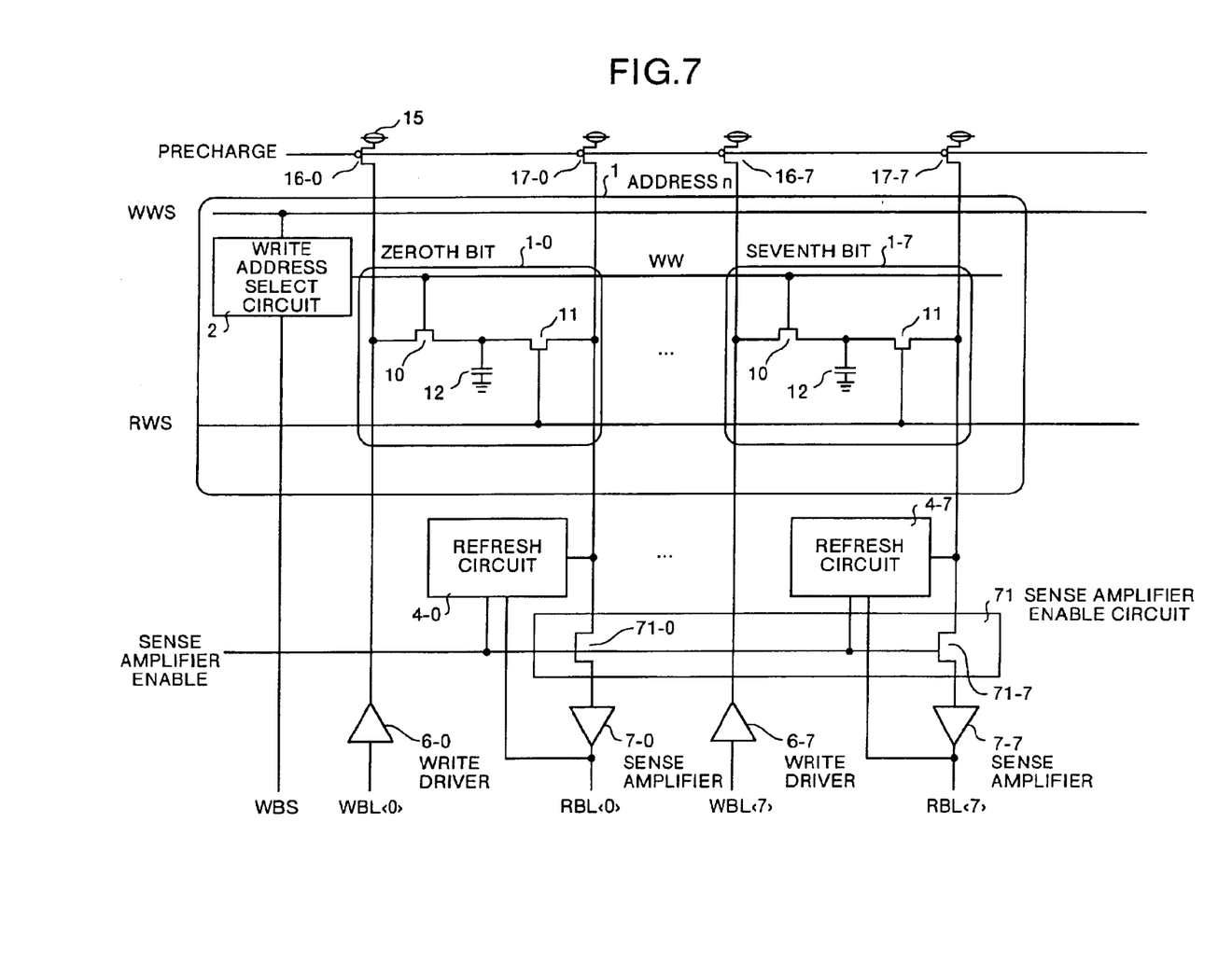
FIG. 7 is a block diagram that shows a configuration of a fifth embodiment of a multi-port memory according to the present invention.

FIG. 7 is a block diagram that shows a configuration of a fifth embodiment of a multi-port memory according to the present invention. In FIG. 7, components that are the same as or equivalent to those shown in FIG. 4 are denoted by like characters. Components concerning the fifth embodiment will now be explained mainly.

As shown in FIG. 7, the multi-port memory of the fifth embodiment has a configuration obtained by replacing the sense amplifier enable circuits 5-0 to 5-7 in the configuration of the second embodiment (FIG. 4) by a sense amplifier enable circuit 71 including NMOS transistors 71-0 to 71-7. The NMOS transistors 71-0 to 71-7 are inserted on the way of the read bit lines (RBL<0> to RBL<7>) respectively connected to the input terminals of the sense amplifier circuits 7-0 to 7-7. The sense amplifier enable signal is connected to gate electrodes of the NMOS transistors 71-0 to 71-7.

When the sense amplifier enable signal is at the "H" level, the NMOS transistors 71-0 to 71-7 turn ON and data bit signals sent to the read bit lines (RBL<0> to RBL<7>) are amplified in the sense amplifier circuits 7-0 to 7-7 and sent out to the read bit lines RBL<0> to RBL<7> extended to the outside, respectively.

According to this configuration, an operation and effects similar to those of the second embodiment can be obtained. According to the fifth embodiment, therefore, it becomes possible to reduce the area of the memory cell and chip size. Although an example of application to the second embodiment has been shown in the fifth embodiment, it is a matter of course that the fifth embodiment can be applied to the first embodiment as well in the same way.

Figure 8:
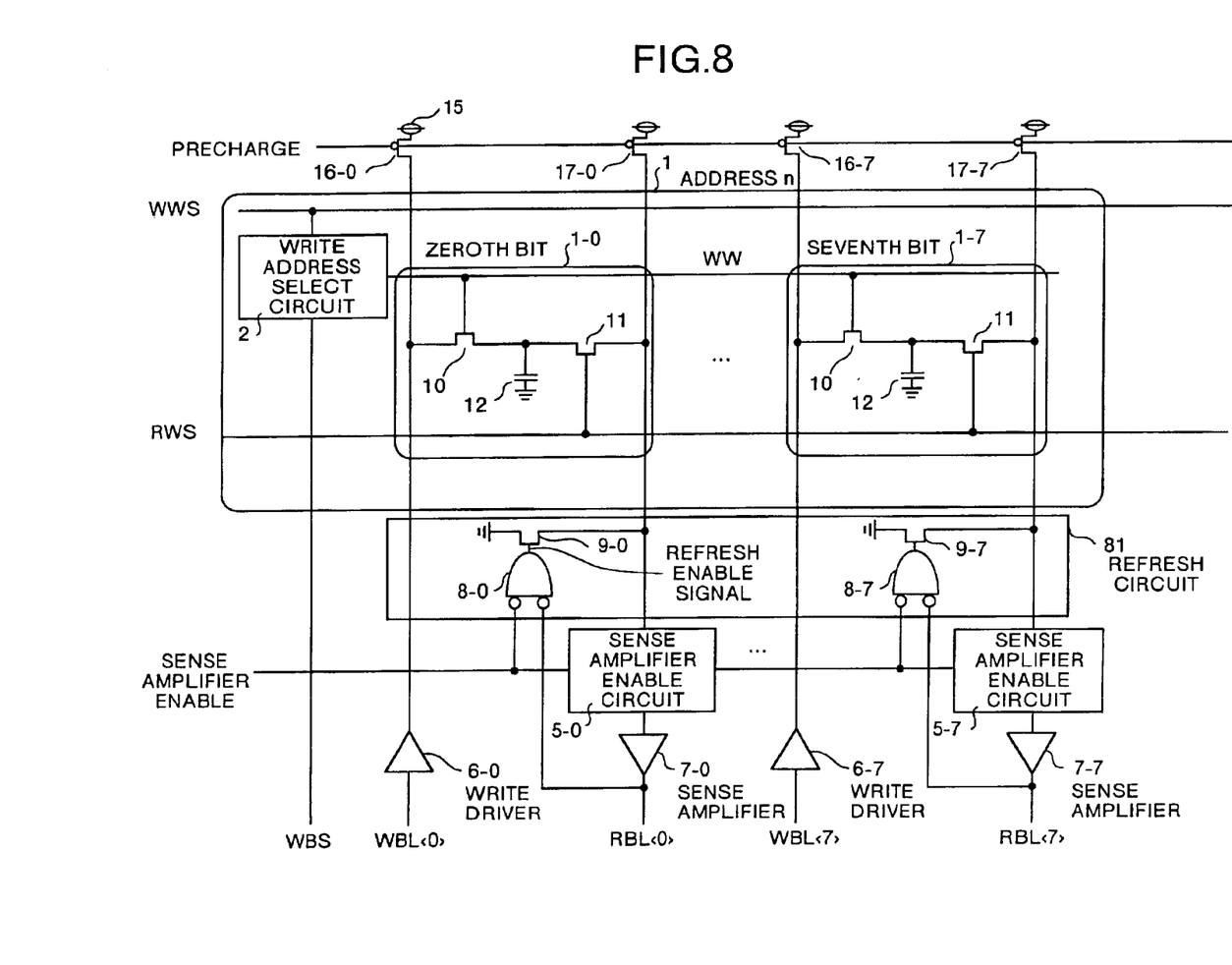
FIG. 8 is a block diagram that shows a configuration of a sixth embodiment of a multi-port memory according to the present invention.

FIG. 8 is a block diagram that shows a configuration of a sixth embodiment of a multi-port memory according to the present invention. In FIG. 8, components that are the same as or equivalent to those shown in FIG. 4 are denoted by like characters. Components concerning the sixth embodiment will now be explained mainly.

As shown in FIG. 8, the multi-port memory of the sixth embodiment has a configuration obtained by replacing the refresh circuits 4-0 to 4-7 in the configuration of the second embodiment (FIG. 4) by a refresh circuit 81. The refresh circuit 81 includes logic gates 8-0 to 8-7 and NMOS transistors 9-0 to 9-7.

The sense amplifier enable signal is input to first input terminals of the logic gates 8-0 to 8-7. The output signals of the sense amplifier circuits 7-0 to 7-7 are input to second input terminals of the logic gates 8-0 to 8-7, respectively. In other words, when the sense amplifier enable signal is at the "L" level and the outputs of the sense amplifier circuits 7-0 to 7-7 are at the "L" level, the logic gates 8-0 to 8-7 are activated respectively and the output terminal is made to the "H" level (refresh enable signal).

The NMOS transistors 9-0 to 9-7 are connected between the ground and the read bit lines (RBL<0> to RBL<7>), respectively. Output terminals of the logic gates 8-0 to 8-7 are connected to gate electrodes of the NMOS transistors 9-0 to 9-7. The NMOS transistors 9-0 to 9-7 receive outputs of the logic gates 8-0 to 8-7 as refresh enable signals, respectively. Thus, the NMOS transistors 9-0 to 9-7 turn ON, and conduct operation of discharging electric charge of the read bit lines (RBL<0> to RBL<7>) to the ground and pulling the read bit lines (RBL<0> to RBL<7>) into the "L" level, respectively.

As a result, the "L" level data is written on the storage node in the memory cells 1. The sense amplifier enable signal is a signal that becomes the "H" level only at the address to be read. Thereafter, at the timing when the sense amplifier enable signal becomes the "L" level, the refresh operation is conducted. Thereafter, the refresh operation can be conducted certainly at the selected address.

According to this configuration, an operation and effects similar to those of the second embodiment can be obtained. According to the sixth embodiment, therefore, it becomes possible to reduce the area of the memory cell and chip size. Although an example of application to the second embodiment has been shown in the sixth embodiment, it is a matter of course that the sixth embodiment can be applied to the first embodiment as well in the same way.

As heretofore explained, according to one aspect of this invention, each memory cell is a dynamic memory cell including two NMOS transistors and one capacitor. At the time of write operation, a first NMOS transistor for the write operation is turned ON by a write address select circuit of an address selected by a write word select signal that orders data word writing and a write bit select signal that orders data bit writing. A data bit is thus written on a storage node. At the time of read operation, read bit lines are precharged by a precharge circuit. A second NMOS transistor for the read operation is turned ON by a read word select signal that orders data word readout, and all addresses in the row direction are selected. At an address selected by an activated read bit line, a sense amplifier circuit is activated by a sense amplifier enable circuit. A data bit held on the storage node is thus read out. If the storage node is at a high level, it is read out as it is without causing data destruction. If the storage node is at a low level, then the read bit line is at a high level because of the precharge. Therefore, potential levels are changed so as to balance the potentials. In other words, data destruction is caused. If the sense amplifier circuit outputs the low level, therefore, a refresh circuit conducts a refresh operation in an interval during which the sense amplifier enable signal is at the low level, and thereby writes a low level on the storage node and restores the low level data bit. Such a memory cell is formed of a dynamic memory cell including two transistors and one capacitor. A multi-port memory for which the write operation and the read operation can be conducted independently of each other is thus obtained. Therefore, the area of the memory cell can be made smaller than a dynamic memory cell formed of three transistors and one capacitor. Thus the chip size can be reduced.

Moreover, at the time of read operation, the second NMOS transistor for read operation is turned ON by a read address select circuit at an address selected by a read word select signal that orders data word readout and a read bit select signal that orders data bit readout. A sense amplifier circuit is activated by a sense amplifier enable circuit. The data bit held on the storage node is thus read. At the time of read operation, therefore, the read operation is conducted only at an address selected by the read address select circuit. As a result, power consumption can be saved.

Furthermore, each of the write address select circuit and the read address select circuit can be formed of a two-input NOR circuit.

Moreover, an NMOS transistor that is inserted on a way of the read bit line turns ON and connects the read bit line to an input terminal of the sense amplifier circuit, when the sense amplifier enable signal is at a high level in the sense amplifier enable circuit. As a result, the potential level on the read bit line is amplified by the sense amplifier circuit, and signals corresponding to data bits of the high level and the low level are output. Therefore, the sense amplifier enable circuit that controls the sense amplifier circuit can be made simple in configuration.

Furthermore, a logic gate in the refresh circuit turns ON an NMOS transistor when the output level of the sense amplifier circuit is low and the level of the sense amplifier enable signal is low. The read bit line is thus connected to the ground. As a result, the low level can be written on the storage node, and the low level data bit can be restored.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A multi-port memory circuit comprising:
   a plurality of dynamic memory cells, each dynamic memory cell including
   a capacitor that forms a storage node;
   a first NMOS transistor having a gate electrode that serves as a write select terminal connected to a write word line, a first signal electrode connected to the storage node, and a second signal electrode connected to a write bit line to write a data bit; and
   a second NMOS transistor having a gate electrode that serves as a read select terminal connected to a read word select signal line that orders data word readout, a first signal electrode connected to the storage node, and a second signal electrode connected to a read bit line to read a data bit;
   a write address select circuit that activates the write word line when selected by a write word select signal that orders data word writing and a write bit select signal that orders data bit writing;
   a plurality of sense amplifier circuits that respectively amplify data bit signals that are respectively output on the read bit lines;
   a plurality of sense amplifier enable circuits that respectively enable the sense amplifier circuits in accordance with a sense amplifier enable signal that becomes a high level in response to activation of the read word select signal line;
   a plurality of refresh circuits each of which, in response to a low level output from corresponding one of the sense amplifiers, writes a low level data bit on the dynamic memory cell again via corresponding one of the read bit lines in an interval during which the sense amplifier enable signal is at a low level; and
   a precharge circuit that precharges the write bit lines and the read bit lines.

2. The multi-port memory circuit according to claim 1, wherein the gate electrode of the second NMOS transistor in the dynamic memory cell is connected as a read select terminal to a read word line, and
   the multi-port memory circuit further comprises a read address select circuit that activates the read word line when selected by a read word select signal that orders data word readout and a read bit select signal that orders data bit readout.

3. The multi-port memory circuit according to claim 1, wherein each of the write address select circuit and the read address select circuit comprises a two-input NOR circuit.

4. The multi-port memory circuit according to claim 1, wherein each of the sense amplifier enable circuits comprises a third NMOS transistor that is inserted on a way of corresponding one of the read bit lines, and that is in an ON-state, when the sense amplifier enable signal is at a high level, in order to connect corresponding one of the read bit lines to an input terminal of corresponding one of the sense amplifier circuits.

5. The multi-port memory circuit according to claim 1, wherein each of the refresh circuits comprises:
   a logic gate that outputs a high level when an output of corresponding one of the sense amplifier circuits is at a low level and the sense amplifier enable signal is at a low level; and
   a fourth NMOS transistor that is in an ON-state, while an output of the logic gate is at a high level, in order to connect corresponding one of the read bit lines to ground.

* * * * *